United States Patent [19]

Yu et al.

[11] Patent Number: 6,136,161
[45] Date of Patent: Oct. 24, 2000

[54] FABRICATION OF ELECTROCHROMIC DEVICE WITH PLASTIC SUBSTRATES

[75] Inventors: Phillip C. Yu, Pittsburgh; David L. Backfisch, Monroeville; John B. Slobodnik, New Kensington; Thomas G. Rukavina, Lower Burrell, all of Pa.

[73] Assignee: PPG Industries Ohio, Inc., Cleveland, Ohio

[21] Appl. No.: 08/152,338

[22] Filed: Nov. 12, 1993

[51] Int. Cl.⁷ ..................................... C23C 14/34
[52] U.S. Cl. ............... 204/192.29; 204/192.26; 427/126.3; 427/164
[58] Field of Search ............... 204/192.15, 192.26, 204/192.29; 427/126.3, 162, 164, 165, 166

[56] References Cited

U.S. PATENT DOCUMENTS 5,244,557  9/1993  Defendini et al. .............. 204/192.29
5,277,986  1/1994  Cronin et al. .................. 427/165 X
5,288,381  2/1994  Cogan et al. .................. 204/192.26

*Primary Examiner*—Nam Nguyen
*Attorney, Agent, or Firm*—Irwin M. Stein

[57] ABSTRACT

A method for fabricating an electrochromic device having organic polymer substrates is described. Each substrate has a surface coated with an organic polymer primer coating onto which is deposited an electroconductive metal oxide film. An electrochromic material is deposited on one electroconductive film and a complementary electrochromic material is deposited on the other electroconductive film. The resultant two substrates are aligned with the electrochromic materials facing one another. A preformed sheet of an ion-conducting polymer is disposed between those electrochromic layers and the resulting sandwich autoclaved.

19 Claims, No Drawings

FABRICATION OF ELECTROCHROMIC DEVICE WITH PLASTIC SUBSTRATES

BACKGROUND OF THE INVENTION

This invention relates generally to the art of electrochromic cells, and more particularly to the art of transparent electrochromic devices comprising plastic substrates.

Conventional electrochromic cells comprise a thin film of a persistent electrochromic material, i.e. a material responsive to the application of an electric field of a given polarity to change from a high-transmittance, non-absorbing state to a lower-transmittance, absorbing or reflecting state and remaining in the lower-transmittance state after the electric field is discontinued, preferably until an electric field of reversed polarity is applied to return the material to the high-transmittance state. The electrochromic film, which is both an ionic and electronic conductor, is in ion-conductive contact, preferably direct physical contact, with a layer of ion-conductive material. The ion-conductive material may be solid, liquid or gel, but is preferably a polymer layer. The electrochromic film and ion-conductive layers are disposed between two electrodes.

As a voltage is applied across the two electrodes, ions are conducted through the ion-conducting layer. When the electrode adjacent to the electrochromic film is the cathode, application of an electric field causes darkening of the film. Reversing the polarity causes reversal of the electrochromic properties, and the film reverts to its high transmittance state. Typically, the electrochromic film, preferably tungsten oxide, is deposited on a glass substrate coated with an electroconductive film such as tin oxide to form one electrode. The counter electrode has typically been a carbon-paper structure backed by a similar tin oxide coated glass substrate or a metal plate.

U.S. Pat. No. 4,174,152 to Giglia et al. discloses electrochromic devices wherein the polymeric electrolyte material is a hydrophilic copolymer of a selected acrylate or methacrylate monomer and a selected acid group containing monomer, e.g. 2-acrylamido-2-methylpropanesulfonic acid.

U.S. Pat. No. 4,335,938 to Giglia discloses electrochromic devices having a layer of tungsten oxide in contact with a layer of organic electrolyte resin comprising a hydrophilic layer of homopolymer of poly(2-acrylamido-2-methylpropanesulfonic acid) with electrode means for changing electrochromic properties of the device. A conventional electrochromic device is described as having a transparent electrochromic electrode comprising a glass substrate with a conductive tin oxide layer and an electrochromic, e.g. tungsten oxide, film; a pigmented, ion-conducting medium layer comprising a self-supporting layer of ion-conductive polymer having a pigment dispersed therein; and an opaque counter electrode such as carbon paper.

U.S. Pat. Nos. 4,361,385 and 4,478,991 to Huang et al. disclose electrochromic devices having a layer of electrochromic tungsten oxide in contact with a polymeric electrolyte wherein the stability and speed of the device are improved by using a copolymer of 2-acrylamido-2-methylpropanesulfonic acid and vinyl sulfonic acid as the polymer electrolyte. An electrochromic film on an electrode is prepared by evaporation of an amorphous film of tungsten oxide onto a glass substrate coated with conductive tin oxide. The polymer mixture is cast, dried and hydrated in contact with the electrochromic film, and then a second electrode consisting of paper-carbon is pressed against the polymer layer with a second tin oxide coated glass plate backing the carbon-paper electrode.

U.S. Pat. Nos. 4,554,319; 4,609,703 and 4,670,350 to Rukavina disclose novel copolymers of acrylic acid and cyancethylacrylate, including terpolymers with hydroxyethylacrylate, useful as primers for bonding metal-containing coatings to organic polymer substrates.

SUMMARY OF THE INVENTION

The electrochromic device of the present invention comprises a polymeric substrate, a primer to bond an electroconductive film to a surface of the polymeric substrate, an electroconductive film, an electrochromic film, an ion-conductive layer, a complementary electrochromic film, and a second polymeric substrate, also bearing a primer which bonds an electroconductive film to a surface thereof. The present invention provides a method for fabricating such an electrochromic article by puddle casting a sheet of polymeric electrolyte and laminating the sheet between electrochromic coated electrodes comprising conductive metal oxide coating on plastic substrates.

DESCRIPTION OF PREFERRED EMBODIMENTS

The polymeric substrate of the present invention is preferably a transparent material suitable for forming lenses which may be used in eyewear. The polymeric substrate may be a low refractive index (about 1.5) material, a relatively high (about 1.6) refractive index material, or a mid-range (about 1.55) refractive index material, depending on the end use. A preferred low index material is a polymer prepared from diethylene glycol bis(allylcarbonate), specifically a polymer prepared from CR-39® monomer, a product of PPG Industries, Inc.

The electroconductive film is preferably a transparent thin film of metal or metal oxide, preferably fluorine-doped tin oxide or tin-doped indium oxide, commonly referred to as ITO (indium/tin oxide), preferably comprising a weight ratio of about 90:10 indium and tin. The film thickness is preferably in the range of 2000 to 4000 Angstroms for acceptable conductivity. The electroconductive film may be deposited by a variety of methods so long as the polymeric substrate is not deleteriously affected. High temperature pyrolytic methods typically used to deposit electroconductive films on glass are not suitable for plastic substrates. A preferred method of depositing ITO on plastic is direct current sputtering, particularly magnetron sputtering (MSVD). The adhesion of electroconductive metal oxide films to plastic substrates is not adequate for electrochromic devices of the present invention.

A primer is disposed at the interface of the plastic substrate and electroconductive film to provide adequate adhesion of the electroconductive film to the plastic substrate, as well as to prevent crazing and/or cracking of the plastic or the electroconductive film. A preferred primer for use in accordance with the present invention is an acrylate copolymer, preferably a copolymer of acrylic acid and a substituted acrylate such as hydroxyethylacrylate, cyanoethylacrylate or methyl methacrylate. Preferably the substituted acrylate is methyl methacrylate and the molar ratio of acrylic acid to methyl methacrylate is from about 3 to 1 to about 1 to 3. The primer is preferably applied to the substrate surface from a solution by dip, flow or other conventional application technique. The solvent is then evaporated and the primer cured at slightly elevated temperature. The solvent may be cyclohexanone, 1-butanol, acetone, mixtures of such solvents, and is preferably 1-propanol. The solution preferably includes a curing catalyst, such as dibutyltindilaurate (DBTDL). A preferred method of applying the primer is to dip a plastic lens into a primer solution, dry, cure, and subsequently polish the primer off the surface not coated with electroconductive film. The thickness of the primer is preferably in the range of about 0.01 to 0.50 microns, more preferably about 0.29 to 0.46 microns for optimum adhesion.

Two primed and electroconductive film coated plastic lenses are paired to form an electrochromic device in accordance with the present invention. One of the pair is further coated, over the electroconductive film, with a layer of electrochromic material. Of the various known electrochromic materials, tungsten oxide is preferred. The tungsten oxide is preferably deposited by direct current (dc) magnetron sputtering of tungsten in an oxidizing atmosphere. The thickness of the tungsten oxide film is preferably in the range of 3000 to 5000 Angstroms. The tungsten oxide is in the clear state as deposited.

The other lens is preferably further coated, over the electroconductive film, with a layer of complementary electrochromic material. Of the various known complementary electrochromic materials, iridium oxide is preferred. The substrate to be coated with iridium oxide is electrochemically charged and left in a reduced state, so that the iridium oxide as deposited is in a reduced state. The iridium oxide is preferably deposited by radio frequency (rf) magnetron sputtering. The thickness of the iridium oxide film is preferably in the range of 300 to 800 Angstroms.

After the two substrates have been primed, electroconductive film coated and electrochromic film coated, the pair are assembled to form a cell. Between the coated surfaces is disposed a layer of polymer which bonds with both surfaces to form a laminated article. The polymer is preferably an ion-conductive polymer electrolyte. In accordance with the present invention, the polymer electrolyte is preferably a proton-conducting polymer. Homopolymers of 2-acrylamido-2-methylpropanesulfonic acid (AMPS®) and copolymers of AMPS with various monomers may be utilized in the form of preformed sheets which are laminated between the substrates. A preferred proton-conducting polymer electrolyte in accordance with the present invention, is a copolymer of vinylsulfonic acid (VSA) and vinylpyrrolidinone (VP), preferably puddle cast and cured prior to autoclave lamination. A preferred composition is disclosed in U.S. Ser. No. 07/633,870 filed Dec. 26, 1990, now abandoned the disclosure of which is incorporated herein by reference.

The present invention will be further understood from the descriptions of specific examples which follow:

EXAMPLE I

Polymer substrates prepared from CR-39® monomer were soaked in 1 molar potassium hydroxide (KOH) solution for twenty minutes, rinsed in deionized water, and then rinsed again in distilled water. Following this cleaning procedure, the substrates were dried in nitrogen. Next, the primer layer was deposited onto the plastic. The primer was a terpolymer consisting of cyanoethylacrylate (CEA), acrylic acid (AA), and methyl methacrylate (MMA) in the solvent cyclohexanone. The base oligomer preparation was 25 percent solids having a mole ratio of 1.2 CEA/2 AA/1 MMA. The weight percents of the oligomer were 9.75 percent 2-cyanoethylacrylate, 9.0 percent acrylic acid, 6.25 percent methylmethacrylate, and 75 percent cyclohexanone; 0.04 percent azobisisobutyronitrile was added as thermal initiator. The oligomer was then thermally polymerized at 90° C. for 24 hours. The primer solution consisted of 21.6 percent base oligomer (25 percent solids), 36.86 percent cyclohexanone, 36.85 percent acetone, 0.05 percent dibutyltindilaurate catalyst, 0.04 percent surfactant (FC-430 from 3M), and 4.6 percent crosslinking agent (ERL-4234 from Union Carbide).

The polymer substrate was dip-coated into the primer solution where the voltage was set at 25 mV at the 0–300 rpm range from a Master Servodyne® controller [Cole Parmer]. The wheel diameter of the coater was 2.75 inches (7 centimeters). All work took place in a laminar flow hood. Following dip-coating, the plastic substrates were placed in a vented oven, where the primer was cured for 8 hours at 80° C. Primer layer thickness was estimated to be 0.25 to 0.51 microns. The substrates were discharged of electrostatic by a Zerostat® gun [Discwasher] and then dried with nitrogen gas.

Next, thin films of $In_2O_3$:Sn (ITO) were deposited onto primed plastic substrates using direct current (dc) magnetron sputtering. The films were deposited at a substrate temperature of 60° C. in an atmosphere of 80 percent argon and 20 percent oxygen at 200 W, for a target size of 40"×6"×¼" (101×15×0.6 cm). Film thicknesses were approximately 2800 Angstroms with a sheet resistance of 20 to 30 ohms per square ($\Omega$/sq). The optical transmittance of the ITO/primer/plastic substrate, at 550 nanometers, was between 82 and 87 percent.

Following this electroconductive coating, the electrochromic layers were separately deposited onto ITO/primer/plastic substrates; tungsten oxide thin films by resistive evaporation and iridium oxide thin films by radio frequency (rf) sputtering. The deposition conditions for resistive evaporation of tungsten oxide included a base pressure of $5\times10^{-5}$ Torr. A voltage of 1.1 kV was then applied to the evaporation boat of $WO_3$ for fifteen minutes; the deposition rate was 7 nanometers per second (nm/sec). A glow discharge consisting of an argon gas plasma was then applied to the surface of the tungsten oxide film for fifteen minutes; this step was found to improve the adhesion of the tungsten oxide film to the ion conducting sheet. The terminating thickness was 3800 Angstroms.

Sputtering of iridium oxide was achieved using an iridium target 2.87 inches (7.3 centimeters) in diameter, with a distance from the target to the substrate of six inches (15.2 centimeters). The base pressure of the chamber was $2.5\times10^{-5}$ Torr. The deposition took place in an oxygen atmosphere, at a pressure of $2\times10^{-3}$ Torr. The rf power was 75 W for eight minutes. Again, a glow discharge consisting of an argon gas plasma was applied to the surface of the iridium oxide film for fifteen minutes. The resulting thickness of iridium oxide was approximately 350 Angstroms. For the entire deposition, the target and chamber were water cooled.

The ion-conducting polymer was puddle cast in sheets at a relative humidity of 30 percent for 16 hours. The thicknesses of the sheets were between 254 and 406 microns and 508 to 660 microns for a surface area of 195.2 $cm^2$. The ion-conducting polymer contained vinyl sulfonic acid (VSA), vinyl pyrrolidinone (VP), and water. The mole ratio of VSA:VP was 1.95:1, and the overall solids concentration was 89.92 percent before dissolution in water. All subsequent work also took place in a relative humidity room set at 30 percent.

For construction of an electrochromic device, either the tungsten oxide/ITO/primer/plastic electrode or the iridium oxide/ITO/primer/plastic electrode was pre-charged in 0.1 normal hydrochloric acid (HCl) at constant currents of $1.0 \times 10^{-3}$ amps. The total coulombic charge was 0.465 C for an area of 18.6 cm². The electrode was removed from the bath and placed on a 0.32 cm thick glass backing plate wrapped in Clysar® sheets. The glass plates were necessary to prevent any warpage or distortion of the plastic during the autoclave cycle, and the Clysar® sheets acted as a release coat; after the autoclave cycle, the electrochromic device was easily removed from the glass plates.

The complementary electrode was also placed on a glass backing plate wrapped in a Clysar® sheet. The ion-conducting polymer sheet was then positioned over the tungsten oxide/ITO/primer/plastic electrode and the iridium oxide electrode was placed on top of the polymer. This sandwich configuration was positioned between the Clysar® wrapped glass backing plates, and thin strips of rubber were placed between the glass plates to prevent warpage during the autoclave cycle. The cell was taped together, packaged in fiberglass, and then placed in an autoclave bag that had an evacuation valve. The bag was removed from the relative humidity room, evacuated, and placed in an autoclave.

The conditions for lamination included a 15 minute pre-evacuation at room temperature and a 10 minute heat and pressure warm-up. The temperature, 65.6° C., and pressure, 25 psi, were held for 30 minutes, followed by a 20 minute cool down period. Throughout this entire autoclave cycle, there was continuous vacuum. The device was then removed from the autoclave, and edge-sealed with a commercial sealant, Torr Seal® [Varian Vacuum Research]. The primer on the outer faces of the device was removed using Novus® Plastic Polish No. 1 and No. 2 [Novus Inc.].

The above examples are offered to illustrate the present invention without limiting its scope, the scope of which is defined by the following claims. Various other materials and process conditions may be used. For example, while the examples utilize ITO as an electroconductive film, other materials such as fluorine-doped tin oxide, antimony-doped tin oxide and aluminum-doped zinc oxide could be used, preferably with sheet resistances in the range of 10 to 20 ohms per square. Other polymer electrolytes, for example comprising hydrogen uranyl phosphate or polyethylene oxide/$LiClO_4$, may also be employed, as well as inorganic films such as $LiNbO_3$, $LiBO_3$, $LiTaO_3$, LiF, $Ta_2O_5$, $Na_2AlF_6$, $Sb_2O_5 \cdot nH_2O + Sb_2O_3$, $Na_2O.11Al_2O_3$, $MgF_2$, $ZrO_2$, $Nb_2O_5$ and $Al_2O_3$. In addition to tungsten oxide, $WO_3$, other cathodically coloring materials such as $MoO_3$, $V_2O_5$, $Nb_2O_5$, $TiO_2$, $Cr_2O_3$, $RuO_2$ and $PrO_2$, may be compatible with the other components of the electrochromic device of the present invention, as well as ternary metal oxides and tungsten bronzes, such as $MoWO_3$, $NbWO_3$, $K_{1-x}WO_3$ and $Na_{1-x}WO_3$, where x is less than 1. In addition to the preferred iridium oxide, other anodically coloring materials which may be used include NiO, $Fe_4[F_3(CN)_6]_3$, $V_2O_5$, $RhO_3$ and $LiCoO_2$. The counterelectrode may also be passive, instead of complementary, utilizing material such as $In_2O_3$, tin-doped indium oxide (ITO) and $Nb_2O_5$. Organic electrochromic materials such as polyanilene and viologens (1,1-diheptyl-4, 4-bipyridinium dibromide) may also be used in the electrochromic devices of the present invention, the scope of which is defined by the following claims.

What is claimed is:

1. A method for fabricating an electrochromic article comprising the steps of:
   (a) depositing an organic polymer primer coating on a surface of each of two organic polymer substrates,
   (b) depositing an electroconductive metal oxide film on each of the primer coatings deposited on said organic polymer substrates,
   (c) depositing a film of an electrochromic material on one of the electroconductive metal oxide films deposited in step (b),
   (d) depositing a film of a complementary electrochromic material on the other electroconductive metal oxide film deposited in step (b),
   (e) assembling the organic polymer substrates of steps (c) and (d) in spaced relationship with the electrochromic and complementary electrochromic films in a facing relationship,
   (f) disposing a preformed sheet of ion-conducting polymer between and in contact with the electrochromic and complementary electrochromic films, and
   (g) applying heat and pressure to laminate said sheet to said electrochromic films.

2. The method of claim 1 wherein said electroconductive metal oxide film is selected from the group consisting of the oxides of tin, indium and mixtures thereof.

3. The method of claim 2 wherein the electroconductive metal oxide film is tin-doped indium oxide, the weight ratio of indium to tin being about 90:10.

4. The method of claim 2 wherein the electroconductive metal oxide film has a thickness of from about 2000 to 4000 Angstroms.

5. The method of claim 1 wherein the electrochromic film is tungsten oxide.

6. The method of claim 5 wherein the tungsten oxide film has a thickness of from about 3000 to 5000 Angstroms.

7. The method of claim 1 wherein the primer is a polymer of acrylic acid and a substituted acrylate selected from the group consisting of hydroxyethylacrylate, cyanoethylacrylate and methylmethacrylate.

8. The method of claim 7 wherein the primer is a polymer of acrylic acid and methylmethacrylate wherein the mole ratio of acrylic acid and methylmethacrylate is from 3:1 to 1:3.

9. The method of claim 7 wherein the primer is a polymer of acrylic acid, cyanoethylacrylate and methylmethacrylate.

10. The method of claim 7 wherein the primer has a thickness of from about 0.01 to about 0.50 microns.

11. The method of claim 1 wherein the complementary electrochromic material is iridium oxide.

12. The method of claim 11 wherein the complementary electrochromic material has a thickness of from about 300 to about 800 Angstroms.

13. The method of claim 1 wherein the ion-conducting polymer is a copolymer of 2-acrylamido-2-methylpropane sulfonic acid and dimethylacrylamide.

14. The method of claim 1 wherein the ion-conducting polymer is a proton-conducting polymer.

15. The method of claim 1 wherein the assembled electrochromic article is placed in an autoclave bag and the bag evacuated before applying heat and pressure to laminate the sheet of ion-conducting polymer to the electrochromic films.

16. The method of claim 1 wherein the electroconductive metal oxide film is selected from the group consisting of the oxides of tin, indium and mixtures thereof, the electrochromic film is tungsten oxide; the complementary electrochromic film is iridium oxide and the ion-conducting polymer is a proton-conducting polymer.

17. The method of claim 16 wherein the electroconductive metal oxide film has a thickness of from about 2000 to 4000 Angstroms; the tungsten oxide film has a thickness of from about 3000 to 5000 Angstroms; and the complementary electrochromic film has a thickness of from about 300 to 800 Angstroms.

18. The method of claim 16 wherein the primer is a polymer of acrylic acid and a substituted acrylate selected from the group consisting of hydroxyethylacrylate, cyanoethylacrylate and methylmethacrylate; and has a thickness of from about 0.01 to 0.50 microns.

19. The method of claim 18 wherein the ion-conducting polymer is a copolymer of 2-acrylamido-2-methylpropane sulfonic acid and dimethylacrylamide.

* * * * *